United States Patent [19]

Takahashi et al.

[11] Patent Number: 5,667,412
[45] Date of Patent: Sep. 16, 1997

[54] PRESS-IN CONTACT

[75] Inventors: Makoto Takahashi; Yukio Saito, both of Tokyo, Japan

[73] Assignee: DDK Ltd., Japan

[21] Appl. No.: 499,970

[22] Filed: Jul. 10, 1995

[30] Foreign Application Priority Data

Jul. 15, 1994 [JP] Japan .................... 6-186273

[51] Int. Cl.$^6$ .................... H01R 13/41
[52] U.S. Cl. .................... 439/751; 439/82
[58] Field of Search .................... 439/751, 82, 873

[56] References Cited

U.S. PATENT DOCUMENTS

| | | | |
|---|---|---|---|
| 4,076,356 | 2/1978 | Tamburro | 439/82 |
| 4,191,440 | 3/1980 | Schramm | 439/751 |
| 4,381,134 | 4/1983 | Anselmo et al. | 439/82 |
| 4,585,293 | 4/1986 | Czeschka et al. | 439/873 |
| 4,776,807 | 10/1988 | Triner et al. | 439/82 |
| 4,795,378 | 1/1989 | Tomizu et al. | 439/82 |

FOREIGN PATENT DOCUMENTS 430717 5/1992 Japan .

OTHER PUBLICATIONS

"Compliant Pin Concepts". Jan. 1989.

*Primary Examiner*—Gary F. Paumen
*Attorney, Agent, or Firm*—Silverman, Cass & Singer, Ltd.

[57] ABSTRACT

A press-in contact has a press-fitting portion which is press-fitted in a cylindrical through-hole of a printed circuit board, thereby fixing the press-in contact to the circuit board. The cross-section of the press-fitting portion of the press-in contact includes a U-shaped inner edge and an outer periphery having two arc parts and a straight part therebetween. The circular part of the U-shaped inner edge at its bottom and the two arc parts of the outer periphery are in eccentric relation of shifted centers. The thickness of the arc parts is progressively thinner toward the open ends of the U-shaped inner edge, and a circumferential length of the arc parts of the outer periphery contacting the through-hole of the printed circuit board is as long as possible. With the press-in contact thus constructed, no whitening occurs in the proximity of the through-hole of the printed circuit board even if the holding force for the contact is more than 5 kg.

3 Claims, 5 Drawing Sheets

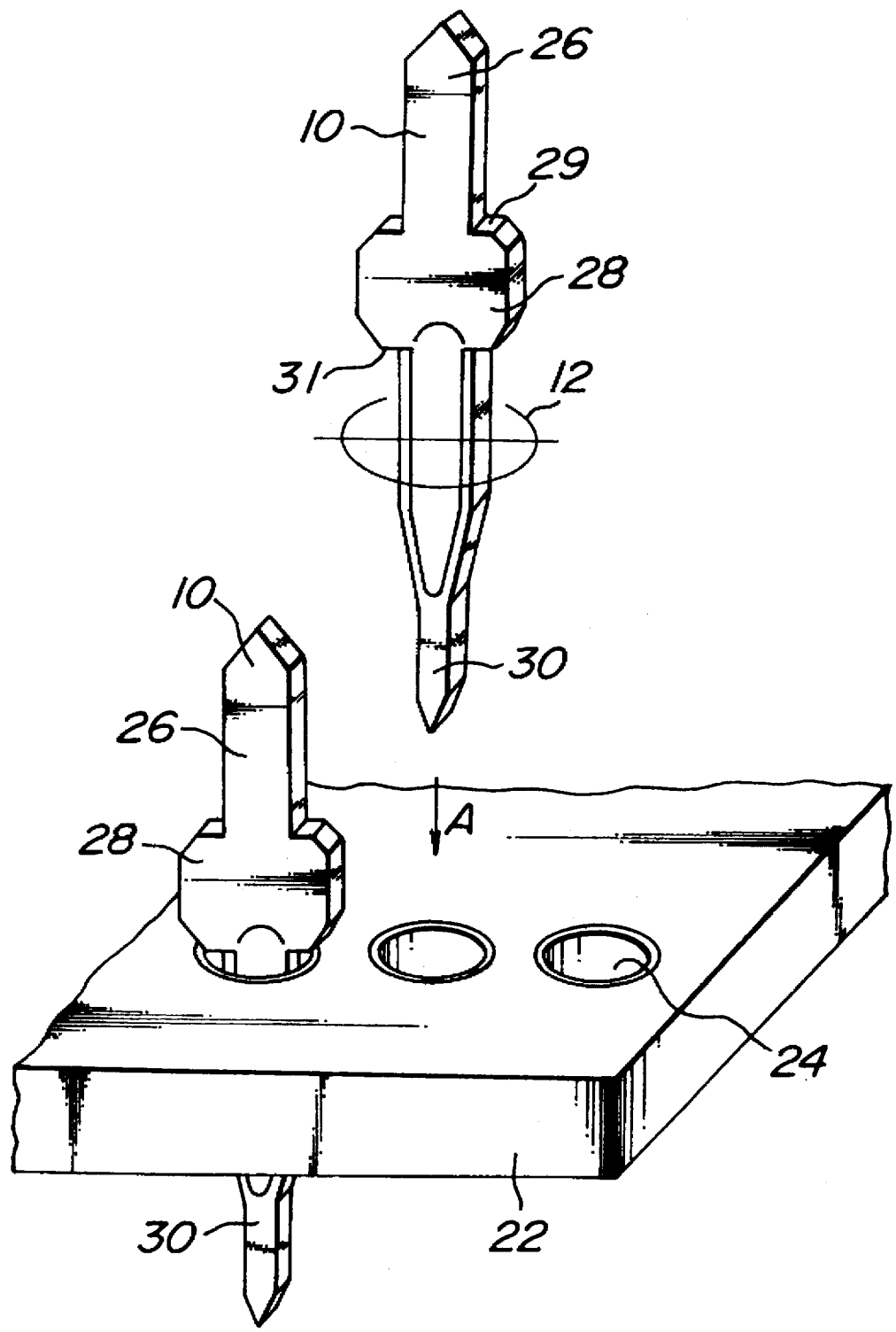
FIG_1

FIG._2a
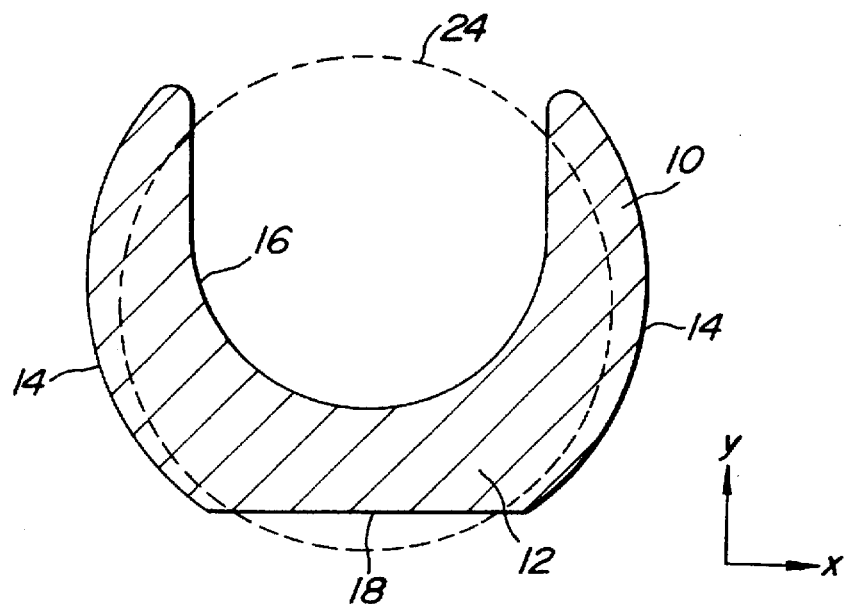
FIG._2b
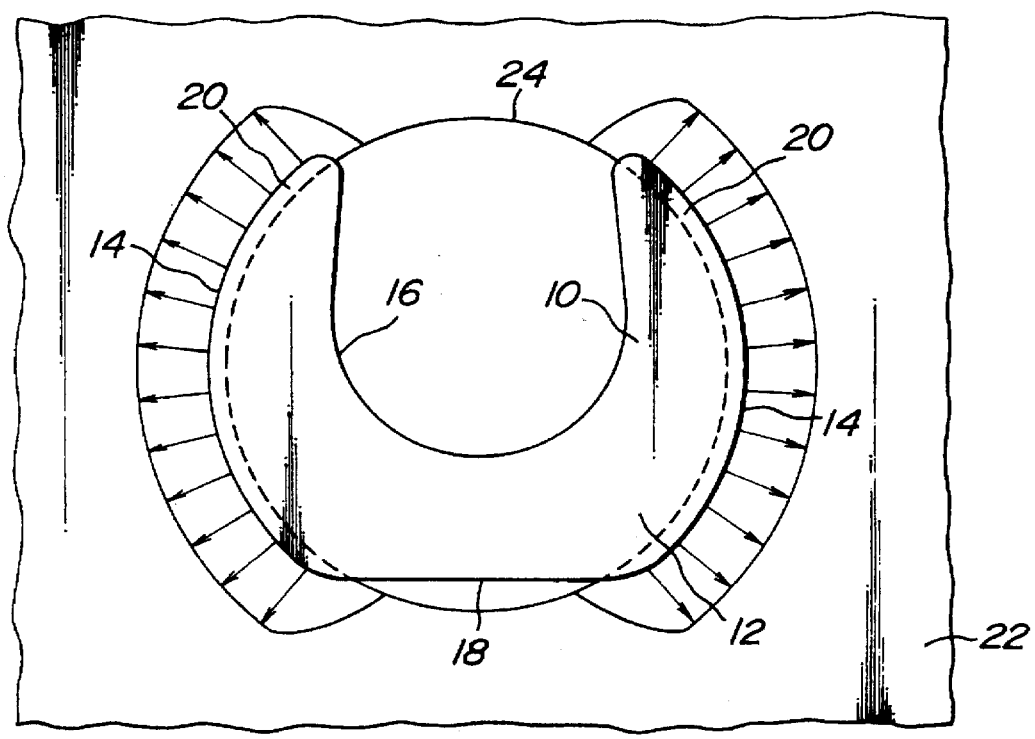

PRESS-IN CONTACT

BACKGROUND OF THE INVENTION

This invention relates to a press-in contact, and more particularly to a construction of the press-fitting portion of a press-in contact to be press-fitted in a through-hole in a printed circuit board for mechanical fixation and electrical connection.

Prior art press-in contacts will be explained with reference to FIGS. 4a and 5a of sectional views respectively illustrating press-fitting portions 34 of press-in contacts and FIGS. 4b and 5b of sectional views respectively illustrating the contacts press-fitted in through-holes of printed circuit boards 22.

A press-in contact is generally made of phosphor bronze or beryllium copper having springiness for press-fitting it into the through-hole 24 of a printed circuit board.

The press-fitting portion 34 of the press-in contact 32 shown in FIG. 4a has a substantially U-shaped cross-section and is press-fitted in the through-hole 24 of the printed circuit board 22 for firmly fixing the press-in contact 32 to the printed circuit board 22 as shown in FIG. 4b.

The inner edge of the press-fitting portion 34 forms a U-shaped groove 38, while the outer periphery of the portion includes a plurality of arc parts 36 and straight parts 40 whose number is one less than that of the arc parts 36.

The curved portion of the U-shaped inner edge is concentric to the arc parts 36 of the outer periphery. The straight parts 40 and the arc parts 36 are alternately arranged so that the straight parts 40 are positioned between the arc parts 36. In the embodiment shown in FIGS. 4a and 4b, there are four arc parts 36 and three straight parts 40, all these parts having substantially equal thicknesses.

When the press-in contact 32 is inserted into the through-hole 24 of the printed circuit board 22, the press-fitting portion 34 of the contact 32 is press-fitted in the through-hole 24 with its arc parts 36. In this case, the arc parts 36 will apply stresses substantially uniformly against the printed circuit board 22 (Japanese Patent Application Publication No. H4-30,717).

In the other embodiment shown in FIG. 5a, there are four arc parts 36 and three straight parts 40 and all these parts have substantially equal thicknesses. The press-in contact shown in FIG. 5a differs from that shown in FIG. 4a in the feature of a V-shaped cross-section section whose arms open somewhat outwardly. When the press-in contact 32 is inserted into the through-hole 24 of the printed circuit board 22, the press-fitting portion 34 of the press-in contact 32 is press-fitted in the through-hole 24 of the printed circuit board 22 with the arc parts 36.

The press-in contact shown in FIG. 5a has a larger press-fitting surface area than that of the contact shown in FIG. 4a but exserts non-uniform stress on the printed circuit board 22.

With each of the above described press-in contacts, since the outer periphery of the press-fitting portion 34 consists of the arc parts 36 and the straight parts 40 arranged therebetween, stress concentration would occur only on that face of the through-hole of the printed circuit board 22 which abut against the arc parts 36.

Moreover, should thicker arc parts 36 be employed for the purpose of increasing the holding force for the contact, extreme stress concentration would occur in this case only on the parts of the through-hole abutting against the arc parts 36.

The stress concentration on the printed circuit board 22 will cause whitening around the through hole 24 of the board, resulting in lowering of dielectric strength, disconnection of circuit, and lowering of insulation resistance. Even if a circuit is disconnected only at one position, exchange of the printed circuit board itself is needed, increasing the cost.

With the press-in contact of the V-shaped cross-section whose arms are in uniform thickness, such contact has an increased rigidity in its entirety but becomes poor in flexibility. Therefore, when the press-in contact is press-fitted in the through-hole of the printed circuit board, the open ends of the V-shaped cross-section do not deform so that non-uniform stress is applied onto the through-hole, tending to cause the whitening of the board.

The word "whitening" used herein means a phenomenon that part of a printed circuit board becomes opaque white resulting from peeling between laminated layers or fine cracks in the board. The whitening is usually found by telescopic observation, although it can be seen by naked eyes.

SUMMARY OF THE INVENTION

It is an object of the invention to provide a press-in contact which does not cause any whitening in a printed circuit board in the periphery of a through-hole of the board into which the press-in contact is press-fitted even if holding force for the contact is more than 5 kg.

The object of the invention is accomplished by the following features according to the invention. The cross-section of the press-fitting portion 12 of the press-in contact 10 includes a U-shaped inner edge and an outer periphery having two arc parts 14 and a straight part 18 therebetween (FIGS. 1 and 2a and 2b). The circular part of the U-shaped inner edge at its bottom and the two arc parts 14 of the outer periphery are in eccentric relation, whose centers are shifted to each other. Further, the thickness of the arc parts is progressively thinner toward the open ends of the U-shaped inner edge, and the arc parts of the outer periphery are as long as possible to an extent that the open ends of the U-shaped portion do not abut against or overlap each other, when the press-in contact is press-fitted in the through-hole of the printed circuit board.

When the press-in contact 10 is press-fitted in the through-hole 24 of the printed circuit board 22, the press-fitting portion 12 of the contact 10 exerts uniform stress onto the inside of the through-hole 24 of the board 22 because of the arc-shaped outer periphery of the press-fitting portion 12 and the significant deformability of the open ends of the U-shaped press-fitting portion 12 resulting from their springiness.

In this manner, the stress is uniformly distributed on the inner face of the through-hole 24 of the printed circuit board 22. Even if a somewhat large press-fitting interference of the portion 12 is employed in order to ensure a sufficient force for holding the contact 10 relative to the board 22, no whitening occurs in the board 22, and decrease in dielectric strength and disconnection of the circuit can be prevented.

As the straight part 18 is provided between the two arc parts 14 of the press-fitting portion 12, there are four corners of the portion 12 abutting against the inside of the through-hole 24, with the result that the contact 10 is prevented from being rotated when lapping connection is applied to an electric wire or cable and the connection portion 26 of the press-in contact 10. As the peripheral length of the arc parts 14 of the press-fitting portion 12 is as long as possible, the area of the portion 12 contacting the through-hole 24 becomes greater.

The press-in contact according to the invention does not cause any whitening in the proximity of the through-hole of the printed circuit board even with the holding force more than 5 kg as shown in Table 1.

TABLE 1

Comparison of the present invention with the prior art

|  | Present Invention | Prior Art |
| --- | --- | --- |
| Shape of press-fitting portion | U-shaped outer periphery having two arc parts and one straight part | U-shaped outer periphery having four arc parts and three straight parts |
| Whitening | No whitening with 5 kg holding force | Occurrence of whitening with 5 kg holding force |
| Rotation of contact during operation of lapping connection | No rotation with 0.2 kgf.cm torque | No rotation with 0.2 kgf.cm torque |

The invention will be more fully understood by referring to the following detailed specification and claims taken in connection with the appended drawings.

BRIEF DESCRIPTION OF THE DRAWINGS

FIG. 1 is a perspective view illustrating a press-in contact according to the invention and a press-in contact which has been press-fitted in a printed circuit board;

FIG. 2a is a cross-sectional view of the press-fitting portion of the press-in contact according to the invention illustrating the positional relation between the press-fitting portion and a through-hole of the printed circuit board;

FIG. 2b is a cross-sectional view of the press-fitting portion of the press-in contact press-fitted in the through-hole;

DESCRIPTION OF THE PREFERRED EMBODIMENT

Figure 3A:
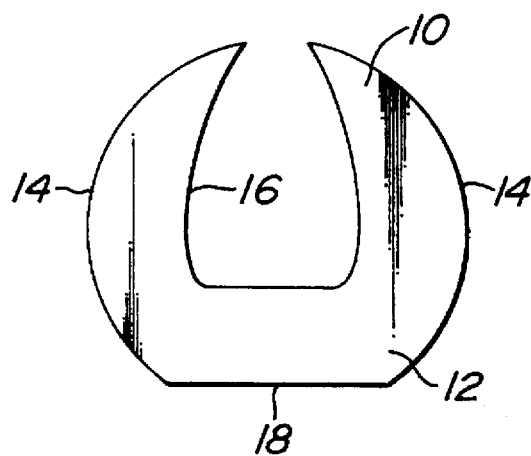
FIGS. 3a to 3c illustrate various cross-sectional shapes of the inner edge of the press-fitting portion of the press-in contact according to the invention.

One embodiment of the invention will be explained with reference to FIG. 1 illustrating a press-in contact 10 and its press-fitted state in one of through-holes 24 of a printed circuit board 22, FIG. 2a illustrating a positional relation between the cross-section of the press-fitting portion 12 of the press-in contact 10 and the through-hole 24 of the printed circuit board 22 and FIG. 2b illustrating the cross-section of the press-fitting portion 12 of the contact 10 press-fitted in the through-hole 24 of the printed circuit board 22.

The press-in contact 10 is made of a copper alloy having springiness such as phosphor bronze, beryllium copper or the like in the same manner as in the prior art.

The press-in contact 10 according to the invention mainly comprises a connection portion 26, a press-fitting portion 12 and a contact portion 30, these portions being arranged in this order. In the shown embodiment, a positioning portion 28 is provided between the connection and press-fitting portions 26 and 12.

The size of the press-in contact according to the invention and the construction, role or the like of its respective portions of the contact will be explained hereinafter.

The press-in contact in the shown embodiment has a width of the order of 1.84 mm, a length of 28.8 mm, and a thickness of 0.64 mm.

The connection portion 26 serves to connect the contact 10 to an electric cable, a circuit on the board or the like. The connection portion 26 in the shown embodiment is a long prism having a 0.64 mm square cross-section and a length of the order of 15.5 mm.

The positioning portion 28 has a face 29 adapted to be in contact with a jig (not shown) when the press-in contact 10 is press-fitted into the through-hole 24 of the printed circuit board 22 and a face 31 adapted to abut against the surface of the printed circuit board 22 when the contact 10 has been press-fitted in the hole 24.

The positioning portion 28 has a width of the order of 1.84 mm, a thickness of 0.64 mm, and a length 1.6 mm.

The contact portion 30 electrically contacts the contact portion of a contact of a mating connector (not shown) when the contact portion 30 is fitted with the mating connector after the press-in contact 10 has been press-fitted in the through-hole 24 of the printed circuit board 22.

The contact portion 30 has a width of the order of 0.4 mm, a thickness of 0.4 mm and a length of 8.1 mm. While the contact portion 30 in the shown embodiment has a particular cross-section obtained by cutting a circle by two parallel straight lines, other cross-section may be used, for example, a circular or rectangular cross-section.

The press-fitting portion will then be explained. The press-fitting portion 12 of the press-in contact 10 according to the invention has a substantially U-shaped cross-section as shown in FIG. 2a. Its inner edge also forms a U-shaped groove 16, while the outer periphery comprises two arc parts 14 and a straight part 18 between these two arc parts 14. The arc parts 14 are press-fitted in the through-hole 24 of the printed circuit board 22 for firmly holding the press-in contact 10 relative to the board 22.

In the shown embodiment, the circular arc of the inner edge and the arc parts 14 of the outer periphery are in a relation of eccentric circles whose centers are shifted slightly of the order of 0.07 to 0.1 mm in the direction of y axis (FIG. 2a). The outer periphery is also eccentric to the through-hole 24 of the board. However, the arc parts 14 of the outer periphery are concentric to the through-hole 24 after the contact has been press-fitted in the hole.

The thickness of the press-fitting portion 12 is progressively thinner toward the open ends of the U-shaped section. The length of the arc parts 14 of the press-fitting portion 12 is made as long as possible to an extent that the open ends of the U-shaped portion 12 do not abut against or overlap each other when press-fitted in the through-hole 24.

The press-fitting portion 12 of the press-in contact 10 in the shown embodiment has a width of the order of 0.65 mm, a thickness of 0.49 mm and a length of 3.6 mm. The width depends upon the diameter of the through-hole 24 as described above, while the length depends upon the thickness of the printed circuit board 22.

The thickness of the press-fitting portion 12 is 0.17 to 0.21 mm at the bottom of the U-shaped section, 0.1 to 0.14 mm at the middle, and 0.03 to 0.08 mm at the open ends.

With the above construction of the press-fitting portion, a springiness is given to the proximity of the open ends so as to apply uniform stress from the contact 10 onto the printed circuit board 22. In other words, the press-fitting portion 12 of the press-in contact 10 according to the invention has a cross-section of the two cantilevers having fixed ends at the straight part 18 so that the open ends of the U-shaped section are deformed on the principle of cantilever to obtain the uniform stress on the circuit board 22.

In addition, the thickness of the press-fitting portion 12 preferably reduces from the maximum (at the bottom of the U-shaped section) toward its open ends with a progressively decreasing rate rather than a substantially constant rate. The decreasing rate will be found by analysis using FEM (finite-element method).

The press-in contact 10 is moved in the direction shown by an arrow A to be press-fitted in the through-hole 24 of the printed circuit board 22 as shown in FIG. 1. In order to prevent the printed circuit board 22 from being scratched on press-fitting the press-in contact 10 into the through-hole 24 of the printed circuit board 22, the open ends of the U-shaped section of the press-fitting portion 12 may be bent inwardly or may be rounded on their outer periphery.

In order to give the springiness to the free ends of the open ends of the U-shaped section to exsert the uniform stress on the printed circuit board 22 after the contact 10 has been press-fitted in the board, the arc parts 14 on the outer periphery of the press-fitting portion is preferably of circular arc, but may be of quadratic curve, such as parabola, ellipse, circle, or the like.

Figure 3B:
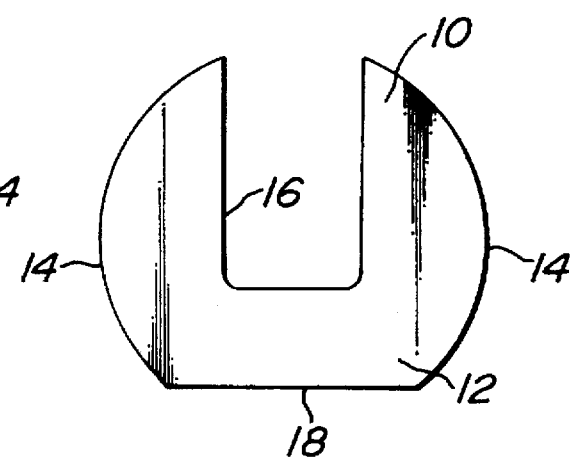
Figure 3C:
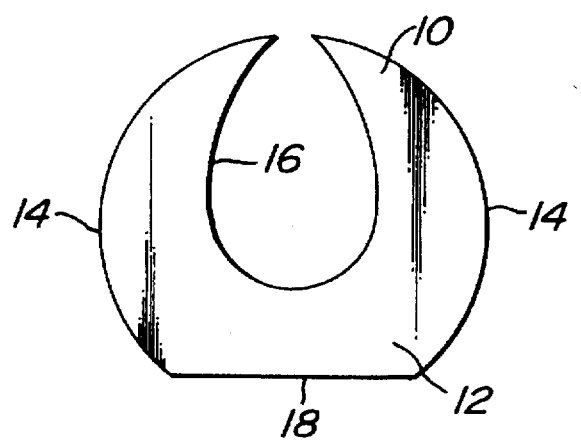
Figure 4A:
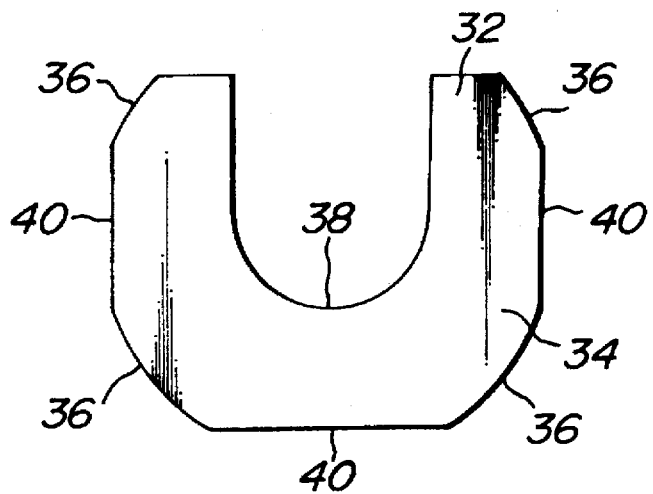
FIG. 4a is a cross-sectional view of the press-fitting portion of a press-in contact of the prior art.
Figure 4B:
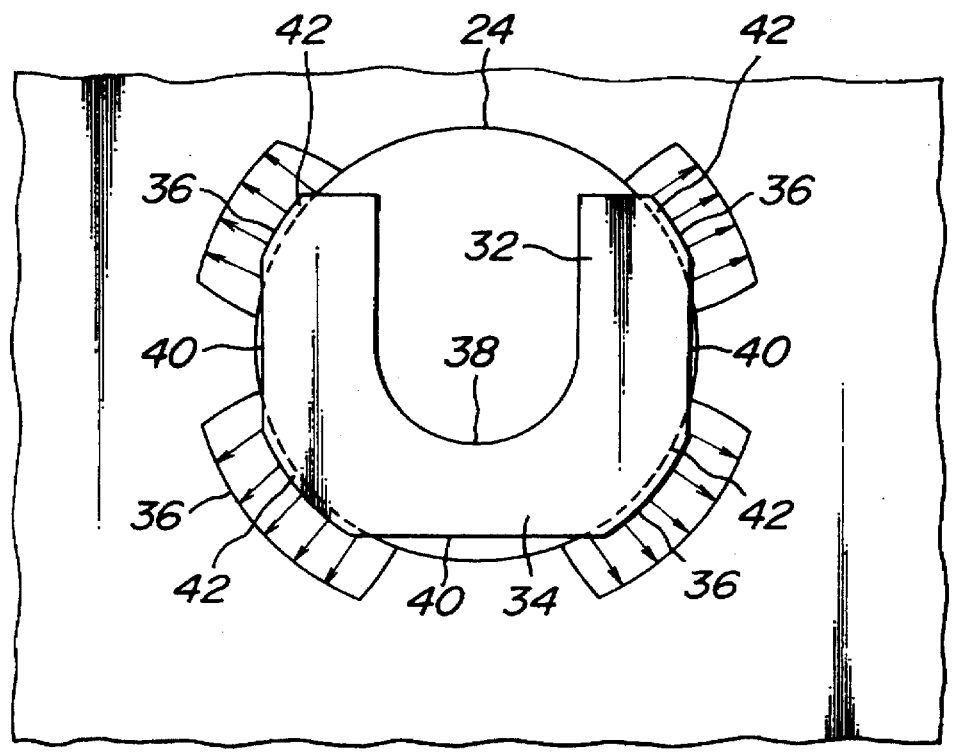
FIG. 4b is a cross-sectional view of the press-fitting portion of the contact shown in FIG. 4a which has been press-fitted in a printed circuit board.
Figure 5A:
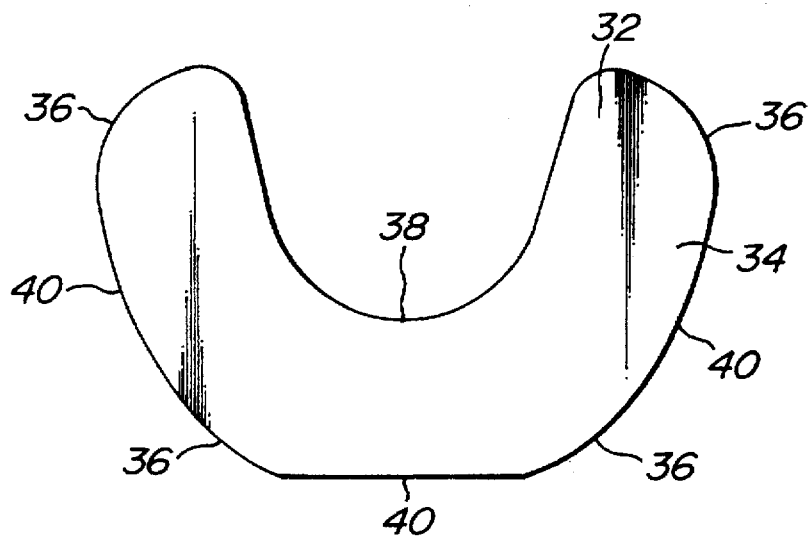
FIG. 5a is a cross-sectional view of the press-fitting portion of another press-in contact of the prior art having a V-shaped cross-section.
Figure 5B:
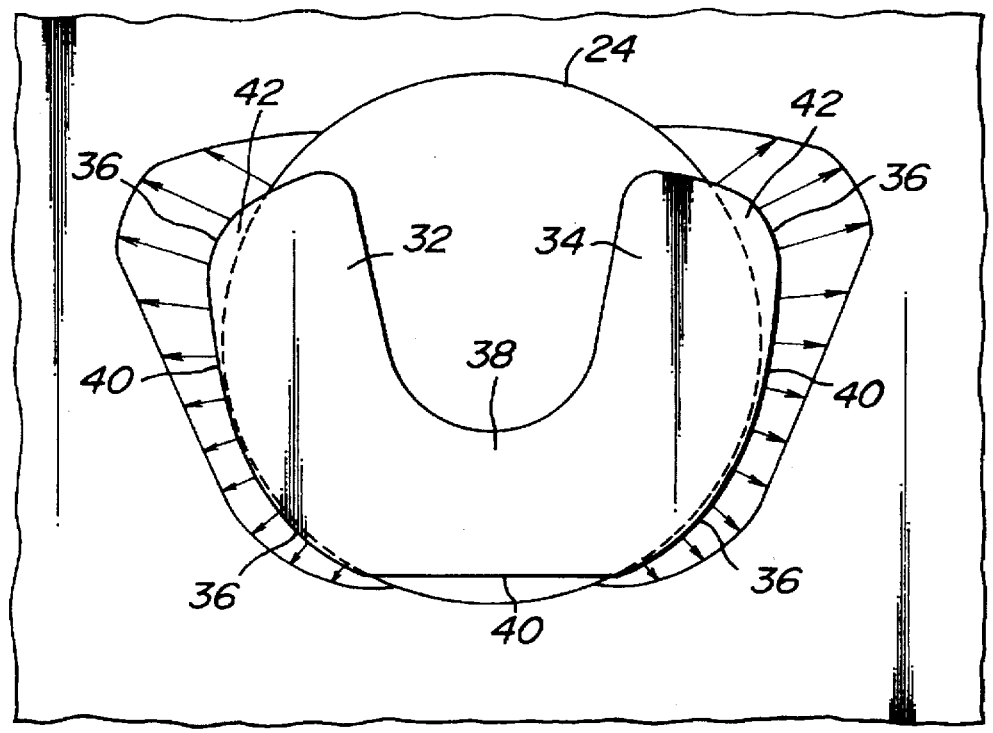
FIG. 5b is a cross-sectional view of the press-fitting portion of the contact shown in FIG. 5a which has been press-fitted in a printed circuit board.

The shape of the inner edge of the press-fitting portion is desired to be U-shaped in view of manufacture and performance, but may be in the form of U letter whose vertical and horizontal portions are substantially straight, in the form of C, or the like, so long as its performance is satisfactory as shown in FIGS. 3a to 3c.

The printed circuit board 22 has a thickness of the order of 2.4 mm and the through-hole 24 has a diameter of 6 mm. These thickness and diameter depend upon applications of circuit boards.

The size of the press-fitting portion 12 of the press-in contact 10 depends upon the thickness of the printed circuit board 22 and the diameter of the through-hole 24 so that these dimensions are to be suitably determined on all occasions.

The force for holding the press-in contact in the printed circuit board can be increased by increasing press-fitting interference or increasing the contact area of the press-fitting portion with the through-hole. According to the invention the force is increased by increasing the contact area of the press-fitting portion with the through-hole 24.

With a printed circuit board 22 having a thickness of 2.4 mm, a press-fitting interference of the order of 0.015 mm suffices to obtain a holding force more than 5 kg. In order to obtain the holding force more than 5 kg with the press-fitting interference of 0.015 mm, however, the circumferential length of the press-fitting portion 12 contacting the through-hole 24 is required to be of the order of 1 mm. Therefore, the length of each of the arc parts 14 is 0.5 mm in this embodiment. In order to ensure the 0.5 mm length of the arc parts 14, the press-fitting portion 12 is cut along a line at a distance of 0.25 mm from the centers of the arc parts 14 to form the straight part 18 in this embodiment.

The press-fitting interference, the length of the arc parts and the position of the straight part 18 to be cut are suitably selected depending on the required holding force on the basis of the general pin contact design standard.

The press-in contact 10 according to the invention is produced by press working. However, the press working is not exclusive, and casting, forging or mechanical cutting may be used so long as dimensional accuracy and performance of the produced contact are satisfactory.

The press-in contact described above is generally produced by press working. For this purpose, first a metal sheet is punched to form continuous press-in contact parts.

Second, the contact part formed in the first step is subjected to drawing to form the press-fitting portion 34 of the press-in contact to have a substantially V-shaped section.

Third, the press-fitting portion 34 drawn into the V-shaped section in the second step is further drawn to have a section including the U-shaped inner edge and the outer periphery having a straight part 40 and a plurality of arc parts 36.

Last, the thus produced contact having the shape of complete press-in contact 32 is cut from the metal sheet. The press-in contact according to the invention can be produced in this manner.

While the invention has been particularly shown and described with reference to preferred embodiments thereof, it will be understood by those skilled in the art that the foregoing and other changes in form and details can be made therein without departing from the spirit and scope of the invention.

What is claimed is:

1. A press-in contact composed of a connection portion to be connected to a cable or a circuit on a circuit board, a press-fitting portion to be press-fitted in and fixed to a cylindrical through-hole of the printed circuit board, and a contact portion to be brought into contact with a contact of a mating connector, wherein the cross-section of said press-fitting portion of the press-in contact includes top ends, a narrowed substantially U-shaped inner edge having a circular bottom and substantially parallel, substantially straight sides, and an outer periphery consisting of two arc parts and a straight part therebetween, said arc parts each extending from said straight parts to the respective top end, said circular part of said U-shaped inner edge at its bottom and said two arc parts of said outer periphery being in eccentric relation, and wherein the thickness of the press-fitting portion reduces from the maximum thickness at the circular bottom toward the top ends with a progressively decreasing rate, and a circumferential surface of said arc parts of said outer periphery contacting the through-hole of said printed circuit board through its substantially whole length.

2. The press-in contact as set forth in claim 1, wherein the top ends are rounded on their outer peripheries in order to prevent the printed circuit board from being scratched.

3. The press-in contact as set forth in claim 1, wherein said arc parts on the outer periphery of the press-fitting portion are substantially circular curves in order that the press-fitted portion of the press-in contact exerts uniform stress on the printed circuit board.

* * * * *